(12) United States Patent
Ahn et al.

(10) Patent No.: US 8,957,415 B2
(45) Date of Patent: Feb. 17, 2015

(54) THIN FILM TRANSISTOR AND THIN FILM TRANSISTOR ARRAY PANEL INCLUDING THE SAME

(71) Applicant: Samsung Display Co., Ltd., Yongin-City, Gyeonggi-Do (KR)

(72) Inventors: Byung Du Ahn, Hwaseong-si (KR); Jun Hyung Lim, Seoul (KR); Jin Seong Park, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 64 days.

(21) Appl. No.: 13/664,180

(22) Filed: Oct. 30, 2012

(65) Prior Publication Data

US 2013/0306965 A1  Nov. 21, 2013

(30) Foreign Application Priority Data

May 21, 2012  (KR) .................. 10-2012-0053720

(51) Int. Cl.
*H01L 29/12* (2006.01)
(52) U.S. Cl.
USPC ............................................. 257/43; 438/158
(58) Field of Classification Search
CPC .............. H01L 29/7869; H01L 29/786; H01L 21/02403; H01L 21/336
USPC .............. 257/43, E29.273, E21.411; 438/104
See application file for complete search history.

(56) References Cited

U.S. PATENT DOCUMENTS

| | | |
|---|---|---|
| 5,972,527 A | 10/1999 | Kaijou et al. |
| 6,727,522 B1 | 4/2004 | Kawasaki et al. |
| 6,878,962 B1 | 4/2005 | Kawasaki et al. |
| 7,061,014 B2 | 6/2006 | Hosono et al. |
| 7,067,843 B2 | 6/2006 | Carcia et al. |
| 7,145,174 B2 | 12/2006 | Chiang et al. |
| 7,189,992 B2 | 3/2007 | Wager, III et al. |
| 7,211,825 B2 | 5/2007 | Shih et al |
| 7,221,016 B2 * | 5/2007 | Inoue et al. ................... 257/315 |
| 7,242,039 B2 | 7/2007 | Hoffman et al. |
| 7,297,977 B2 | 11/2007 | Hoffman et al. |
| 7,339,187 B2 | 3/2008 | Wager, III et al. |
| 7,393,600 B2 | 7/2008 | Inoue et al. |
| 7,768,042 B2 | 8/2010 | Park et al. |

(Continued)

FOREIGN PATENT DOCUMENTS

| | | |
|---|---|---|
| CN | 101794819 A | 8/2010 |
| EP | 1976019 A1 | 10/2008 |

(Continued)

OTHER PUBLICATIONS

Furubayashi, Yutaka, et al., "A transparent metal: Nb-doped anatase TiO2," Applied Physics Letters, vol. 86, 2005, pp. 252101-1-252101-3.

(Continued)

*Primary Examiner* — Theresa T Doan
(74) *Attorney, Agent, or Firm* — Cantor Colburn LLP

(57) ABSTRACT

A thin film transistor includes: a gate electrode on a substrate; a source electrode; a drain electrode positioned in a same layer as the source electrode and facing the source electrode; an oxide semiconductor layer positioned between the gate electrode and the source electrode or drain electrode; and a gate insulating layer positioned between the gate electrode and the source electrode or drain electrode. The oxide semiconductor layer includes titanium oxide (TiOx) doped with niobium (Nb).

12 Claims, 12 Drawing Sheets

(56) References Cited

U.S. PATENT DOCUMENTS

| | | |
|---|---|---|
| 7,888,594 B2 | 2/2011 | Lu et al. |
| 2005/0017244 A1 | 1/2005 | Hoffman et al. |
| 2006/0108636 A1 | 5/2006 | Sano et al. |
| 2006/0113536 A1 | 6/2006 | Kumomi et al. |
| 2006/0113549 A1 | 6/2006 | Den et al. |
| 2006/0113565 A1 | 6/2006 | Abe et al. |
| 2007/0023750 A1 | 2/2007 | Chiang et al. |
| 2007/0052025 A1 | 3/2007 | Yabuta |
| 2007/0194379 A1 | 8/2007 | Hosono et al. |
| 2008/0254569 A1 | 10/2008 | Hoffman et al. |
| 2009/0090914 A1 | 4/2009 | Yano et al. |
| 2009/0189153 A1 | 7/2009 | Iwasaki et al. |
| 2009/0267064 A1 | 10/2009 | Yano et al. |
| 2009/0278122 A1 | 11/2009 | Hosono et al. |
| 2009/0280600 A1 | 11/2009 | Hosono et al. |
| 2010/0117074 A1 | 5/2010 | Yamazaki et al. |
| 2010/0176388 A1 | 7/2010 | Ha et al. |
| 2010/0193783 A1* | 8/2010 | Yamazaki et al. .............. 257/43 |
| 2010/0224916 A1 | 9/2010 | Shimizu et al. |

FOREIGN PATENT DOCUMENTS

| | | |
|---|---|---|
| EP | 1976019 B1 | 6/2011 |
| JP | 5198853 A | 8/1993 |
| JP | 5251705 A | 9/1993 |
| JP | 4164562 B2 | 8/2008 |
| JP | 4170454 B2 | 8/2008 |
| JP | 2008252097 A | 10/2008 |
| JP | 2009123957 A | 6/2009 |
| JP | 201045263 A | 2/2010 |
| JP | 2010161373 A | 7/2010 |
| JP | 2010219094 A | 9/2010 |
| JP | 201233854 A | 2/2012 |
| KR | 19960002292 B1 | 2/1996 |
| KR | 1020080069607 A | 7/2008 |
| KR | 100930057 B1 | 11/2009 |
| KR | 1020100051550 A | 5/2010 |
| KR | 100983544 B1 | 9/2010 |
| KR | 101064402 B1 | 9/2011 |
| KR | 1020110124530 A | 11/2011 |
| KR | 1020110128038 A | 11/2011 |
| WO | 03040441 A1 | 5/2003 |
| WO | 2007032294 A1 | 3/2007 |

OTHER PUBLICATIONS

Ok, Kyung-Chul, et al., "Semiconducting behavior of niobium-doped titanium oxide in the amorphous state," Applied Physics Letters, vol. 100, 2012, pp. 142103-1-142103-3.

Takeuchi, Utahito, et al., "Transport properties and electronic states of anatase Ti1-xWx)2 epitaxial thin films," Journal of Applied Physics, vol. 107, 2010, pp. 023705-1-023705-4.

* cited by examiner

US 8,957,415 B2

THIN FILM TRANSISTOR AND THIN FILM TRANSISTOR ARRAY PANEL INCLUDING THE SAME

This application claims priority to Korean Patent Application No. 10-2012-0053720 filed on May 21, 2012, and all the benefits accruing therefrom under 35 U.S.C. §119, the entire contents of which are incorporated herein by reference.

BACKGROUND (a) Field

The invention relates to a thin film transistor and a thin film transistor array panel including the same.

(b) Description of the Related Art

Flat panel displays such as a liquid crystal display ("LCD"), an organic light emitting diode ("OLED") display, an electrophoretic display, a plasma display, and the like include multiple pairs of electric field generating electrodes and an electro-optical active layer interposed therebetween. The liquid crystal display includes a liquid crystal layer as the electro-optical active layer, and the organic light emitting display includes an organic light emitting layer as the electro-optical active layer. Either one of a pair of electric field generating electrodes is generally connected to a switching element to receive an electrical signal, and the electro-optical active layer between the electric field generating electrodes converts the electrical signal into an optical signal to display an image.

The flat panel display may include a display panel having a thin film transistor as the switching element. The display panel having the thin film transistor may be referred to a thin film transistor array panel. The thin film transistor array panel includes multiple patterned electrodes and/or semiconductors, and masks are generally used in a patterning process.

The semiconductor is an important factor in determining the characteristics of the thin film transistor. The semiconductor primarily includes amorphous silicon, however the charge mobility thereof is low such that there is a limit in manufacturing a high performance thin film transistor. Also, when using polysilicon, the charge mobility is high such that manufacturing of the high performance thin film transistor is easy, however, the cost is high and uniformity is low such that there is a limit in manufacturing a large-sized thin film transistor array panel.

SUMMARY

One or more embodiment of the invention relates to a thin film transistor including an oxide semiconductor material with a low cost, and a thin film transistor array panel including the same.

An exemplary embodiment of a thin film transistor according to the invention includes: a gate electrode on a substrate; a source electrode; a drain electrode facing the source electrode; an oxide semiconductor layer positioned between the gate electrode and the source electrode or the drain electrode; and a gate insulating layer positioned between the gate electrode and the source electrode or drain electrode. The oxide semiconductor layer includes titanium oxide (TiOx) doped with niobium (Nb).

An amount of niobium doped to the titanium oxide may be in a range from equal to or more than about 1 atomic percent (at. %) to equal to or less than about 17 at. %.

The oxide semiconductor layer may be formed by a heat treatment, and the oxide semiconductor layer may be maintained in an amorphous state after the heat treatment.

The oxide semiconductor layer may be heat-treated at a temperature in a range from equal to or more than about 350 degrees Celsius (° C.) to equal to or less than about 550° C.

The gate electrode may be positioned under the oxide semiconductor layer, and the source electrode and the drain electrode may be positioned on the oxide semiconductor layer.

An etch stopper covering a channel portion of the oxide semiconductor layer and overlapping edges of side surfaces where the source electrode and the drain electrode face each other, may be further included.

An insulating layer positioned on the source electrode and the drain electrode, and covering an exposed upper surface of the etch stopper between the source electrode and the drain electrode, may be further included.

The etch stopper may include an oxide or nitride including silicon.

The insulating layer may include at least one of silicon oxide (SiOx), silicon nitride (SiNx), or silicon oxynitride (SiON).

The gate electrode may be positioned on the oxide semiconductor, and the source electrode and the drain electrode may be positioned under the oxide semiconductor.

An exemplary embodiment of a thin film transistor array panel according to the invention may include: a substrate; a gate line positioned on the substrate and including a gate electrode; a gate insulating layer positioned on the gate line; an oxide semiconductor layer positioned on the gate insulating layer; a data line positioned on the oxide semiconductor layer and connected to a source electrode; a drain electrode facing the source electrode on the oxide semiconductor; and a passivation layer positioned on the data line, the source electrode and the drain electrode. The oxide semiconductor layer includes titanium oxide (TiOx) doped with niobium (Nb).

An amount of niobium doped to the titanium oxide may be in a range from equal to or more than about 1 at. % to equal to or less than about 17 at. %.

The oxide semiconductor layer may be formed by heat treatment, and the oxide semiconductor layer may be maintained in an amorphous state after the heat treatment.

The oxide semiconductor layer may be heat-treated at a temperature of equal to or more than about 400° C.

The oxide semiconductor layer except for a channel portion may have a same plane shape as the source electrode, the drain electrode and the data line.

A pixel electrode positioned on the passivation layer may be further included, the passivation layer may have a contact hole, and the pixel electrode and the drain electrode may be connected through the contact hole.

According to one or more exemplary embodiment of the invention, the oxide semiconductor layer including the titanium oxide (TiOx) is doped with niobium (Nb) such that the amorphous state may be maintained after the heat treatment, and an excellent semiconductor characteristic may be obtained.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Figure 1:
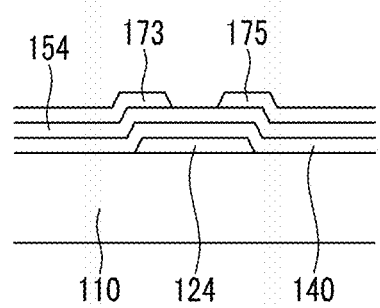
FIG. 1 is a cross-sectional view of an exemplary embodiment of a thin film transistor according to the invention.

The invention will be described more fully hereinafter with reference to the accompanying drawings, in which exemplary embodiments of the invention are shown. However, the invention is not limited to exemplary embodiments described herein, and may be embodied in other forms. Rather, exemplary embodiments described herein are provided to thoroughly and completely describe the disclosed contents and to sufficiently transfer the ideas of the invention to a person of ordinary skill in the art.

In the drawings, the thicknesses of layers and regions are exaggerated for clarity. It is to be noted that when a layer is referred to as being "on" another layer or substrate, it can be directly formed on the other layer or substrate or can be formed on the other layer or substrate with a third layer interposed therebetween. Like constituent elements are denoted by like reference numerals throughout the specification. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A thin film transistor using an oxide semiconductor having high charge mobility and a high ON/OFF ratio of current compared with amorphous silicon and having a low cost and high uniformity compared with polysilicon, has been researched. Research using an oxide material including indium or gallium as the oxide semiconductor has progressed. However, these materials are still expensive, and crystallization may be generated in a process of a heat treatment to obtain the characteristic of the oxide semiconductor, such that uniformity may be undesirably decreased.

Hereinafter, the invention will be described in detail with reference to the accompanying drawings.

FIG. 1 is a cross-sectional view of an exemplary embodiment of a thin film transistor according to the invention.

A gate electrode 124 is positioned on a substrate 110. The substrate 110 may be an insulation substrate and may include plastic or glass, but is not limited thereto or thereby.

The gate electrode 124 may include an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta), titanium (Ti), etc. The gate electrode 124 may include a transparent conductive material such as indium tin oxide ("ITO"), indium zinc oxide ("IZO") and aluminum doped zinc oxide ("AZO"), but is not limited thereto or thereby.

In the exemplary embodiment, the gate electrode 124 is a single layer structure, however, is not limited thereto, and may be a dual layer or a triple layer structure.

In a case of the dual-layer structure, the gate electrode 124 may include a lower layer and an upper layer. The lower layer may include at least one of a molybdenum-based metal such as molybdenum (Mo) or a molybdenum alloy, chromium (Cr) or a chromium alloy, titanium (Ti) or a titanium alloy, tantalum (Ta) or a tantalum alloy, or manganese (Mn) or a manganese alloy. The upper layer may include at least one of the aluminum-based metal such as aluminum (Al) or an aluminum alloy, the silver-based metal such as silver (Ag) or a silver alloy, the copper-based metal such as copper (Cu) or a copper alloy. In the triple-layer structure, different layers having different physical properties may be combined. As used herein, an element "based" material may contain at least one element.

A gate insulating layer 140 is positioned on the gate electrode 124. The gate insulating layer 140 may include at least one of silicon nitride (SiNx), silicon oxide (SiOx), silicon oxynitride or an organic insulating material, but is not limited thereto or thereby. The gate insulating layer 140 may have a multilayered structure including at least two insulating layers (not shown). In one exemplary embodiment, for example, an upper layer of the gate insulating layer 140 may include SiOx and a lower layer may include SiNx, or the upper layer may include SiOx and the lower layer may include SiON. When the gate insulating layer 140 contacting an oxide semiconductor layer 154 includes an oxide, degradation of the channel may be reduced or effectively prevented.

The oxide semiconductor layer 154 is positioned on the gate insulating layer 140.

The exemplary embodiment of the oxide semiconductor layer 154 includes titanium oxide (TiOx) doped with niobium (Nb). Also, the oxide semiconductor layer 154 is heat-treated to obtain a semiconductor characteristic in a state of having an insulating characteristic.

In an exemplary embodiment of forming the oxide semiconductor layer 154 including titanium oxide (TiOx) doped with niobium (Nb), the heat treatment temperature may be in a range more than about 350 degrees Celsius (° C.) to less than about 550° C. If the heat treatment temperature is over 550° C., an amorphous characteristic may be lost, and if the heat treatment temperature is less than 350° C., generation of the semiconductor characteristic may be difficult.

In the exemplary embodiment, an amount of niobium (Nb) doped to the titanium oxide (TiOx) is in a range of more than about 1 atomic percent (at. %) to less than about 17 at. %, but is not limited thereto or thereby. In detail, when the chemical formula of the titanium oxide (TiOx) doped with niobium (Nb) forming the oxide semiconductor layer 154 is referred to as $(Nb)_y(Ti)_{1-y}O_x$, x may be $0<x\leq 2$ and y may be $0.01\leq y\leq 0.17$, specifically $0\leq x\leq 1.8$ and $0.05\leq y\leq 0.15$. The above-described range of niobium (Nb) will be described with reference to FIG. 2 below.

Figure 2:
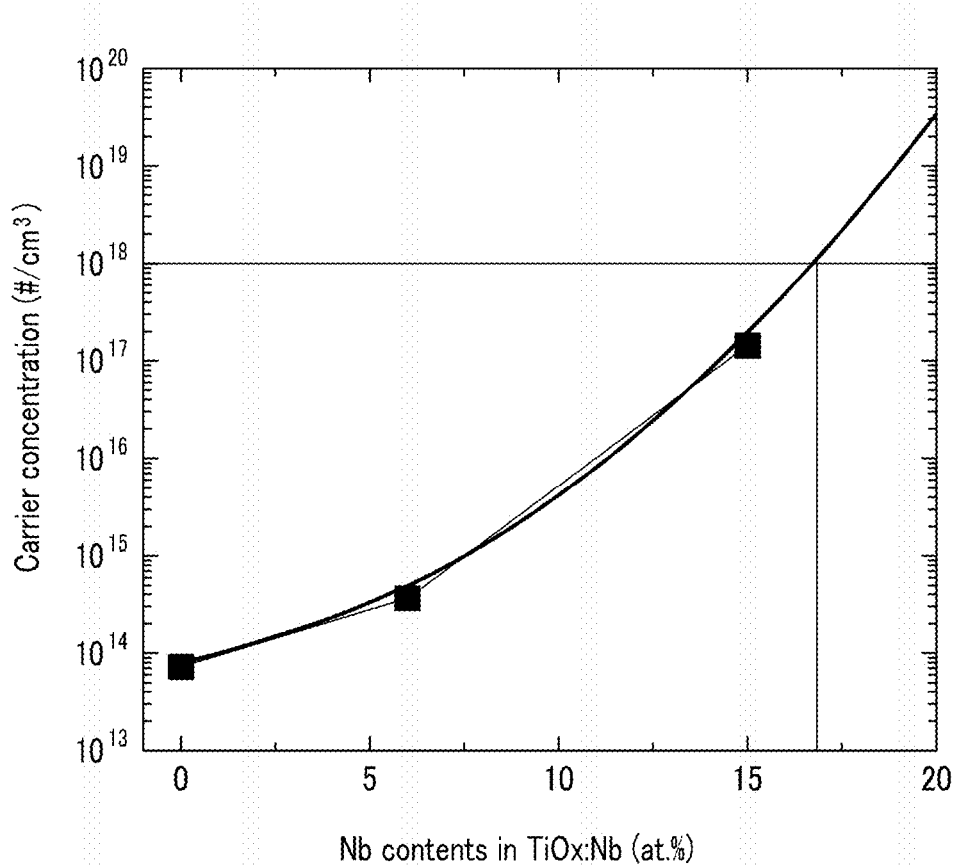
FIG. 2 is a graph of a carrier concentration in units of number per square centimeter (#/cm$^3$) according to a niobium amount in units of atomic percent (at. %), in exemplary embodiments of an titanium oxide semiconductor, according to the invention.

FIG. 2 is a graph of a carrier concentration in units of number per square centimeter (#/cm³) according to a niobium amount in at. %, in exemplary embodiments of an titanium oxide semiconductor, according to the invention.

Referring to FIG. 2, as the amount of niobium (Nb) doped to the titanium oxide (TiOx) is increased, a concentration (a number of carriers per unit volume) of the carrier tends to be increased. If the carrier concentration is very low, the oxide semiconductor layer becomes an insulator. One or more exemplary embodiment includes niobium (Nb) doped at equal to or more than about 1 at. % at a minimum for the carrier concentration to be equal to or more than about $10^{14}$/cm³. That is, the amount of about 1 at. % of the doped niobium (Nb) is considered a lower limit of the range of niobium (Nb) amount.

Also, in general, when considering a point that the carrier concentration must be equal to or less than about $10^{18}$/cm³ to form the semiconductor, niobium (Nb) is doped at equal to or less than about 17 at. %. That is, the amount of about 17 at. % of the doped niobium (Nb) is considered an upper limit of the range of niobium (Nb) amount such that the oxide semiconductor layer to not be a conductor and to function as a channel portion.

Again referring to FIG. 1, a source electrode 173 and a drain electrode 175 face each other on the oxide semiconductor layer 154 while exposing a channel portion of the oxide semiconductor layer 154. The source electrode 173 and the drain electrode 175 are in a same layer of the thin film transistor structure.

Figure 3:
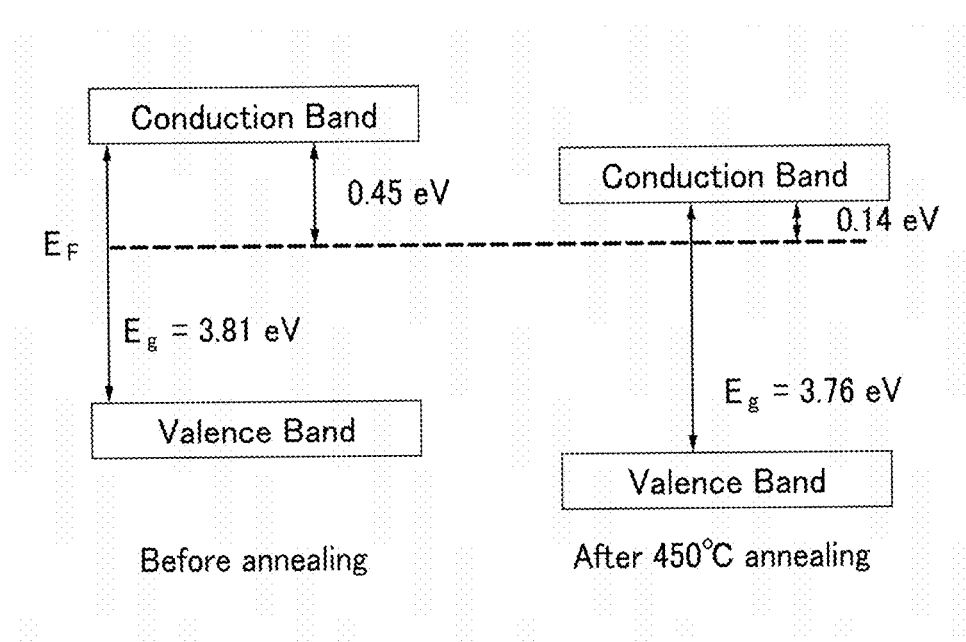
FIG. 3 is a view of an energy band diagram before and after a heat treatment of an exemplary embodiment of an oxide semiconductor layer according to the invention.

FIG. 3 is a view of an energy band diagram before and after a heat treatment of an exemplary embodiment of an oxide semiconductor layer according to the invention.

An exemplary embodiment of an oxide semiconductor layer according to the invention includes titanium oxide doped with niobium. Referring to FIG. 3, a band gap ($E_g$) of the oxide semiconductor layer that is heat-treated at 450° C. is slightly decreased from 3.81 electron volts (eV) to 3.76 eV. However a Fermi level ($E_F$-$E_g$) after the heat treatment is sharply decreased from 0.45 eV to 0.14 eV such that the level is close to a conduction band minimum. Accordingly, it may be confirmed that the carrier concentration is increased in the oxide semiconductor thin film.

Figure 4:
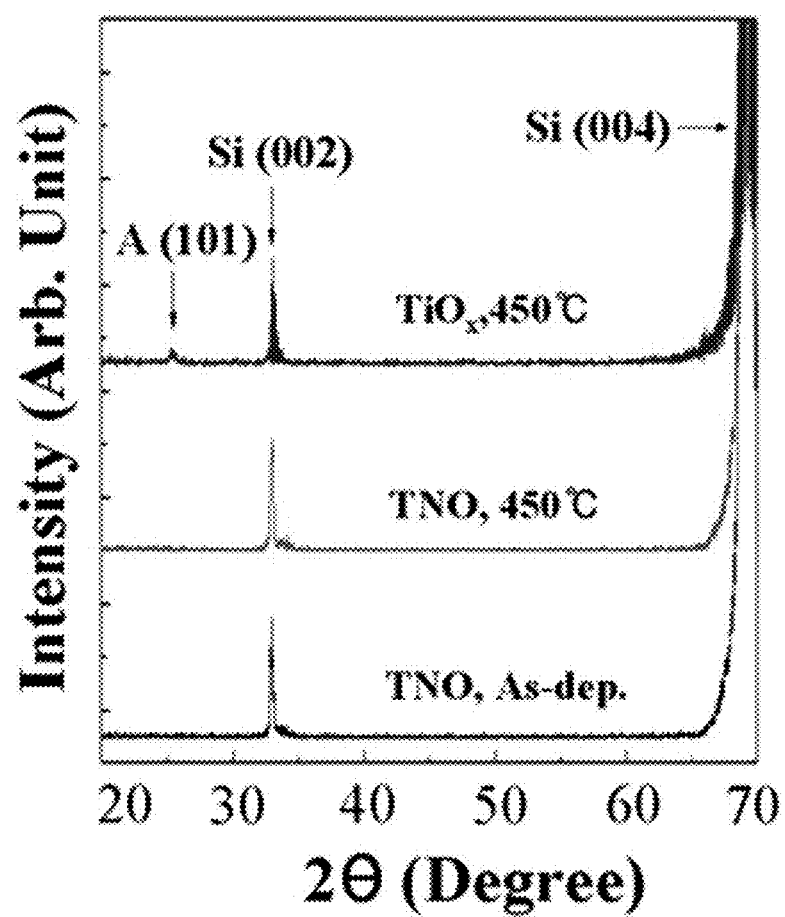
FIG. 4 is a x-ray diffraction ("XRD") analysis graph of intensity in arbitrary units (Arb. Unit) according to a heat treatment in degrees of exemplary embodiments of doping niobium to titanium oxide, according to the invention.

FIG. 4 is an x-ray diffraction ("XRD") analysis graph according to a heat treatment in exemplary embodiments of doping niobium to titanium oxide according to the invention.

Referring to FIG. 4, in a case of titanium oxide (TiOx) that is not doped (top curve), if the heat treatment is performed at 450° C., a peak where crystallization is generated appears. However, in the case of titanium oxide (TiOx) that is doped with niobium (Nb) to form titanium niobium oxide (TNO) (middle and bottom curves), almost the same peak is formed after the heat treatment (middle curve) as that formed with the as-deposited material before the heat treatment (bottom curve) such that it may be confirmed that the crystallization is not generated. Here, niobium (Nb) has a function of suppressing the crystallization of the oxide semiconductor layer including the titanium oxide (TiOx).

An effect of suppressing the crystallization of niobium will be described with reference to an electron micrograph in FIG. 5.

Figure 5A:
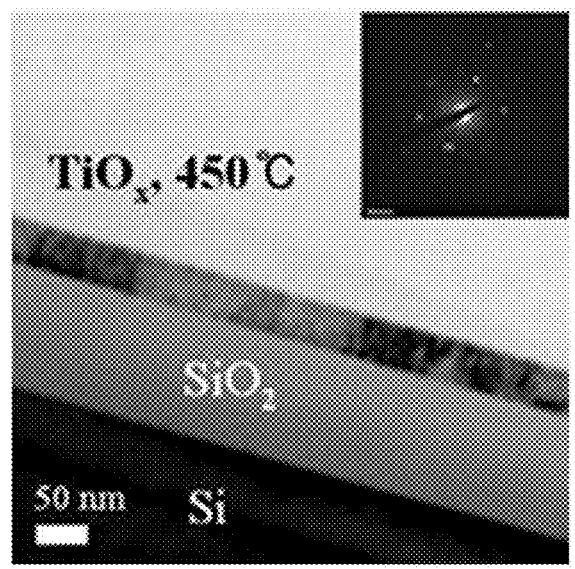
FIG. 5A and FIG. 5B are electron micrographs of a thin film structure in which an oxide semiconductor layer including titanium oxide is heat-treated.
Figure 5B:
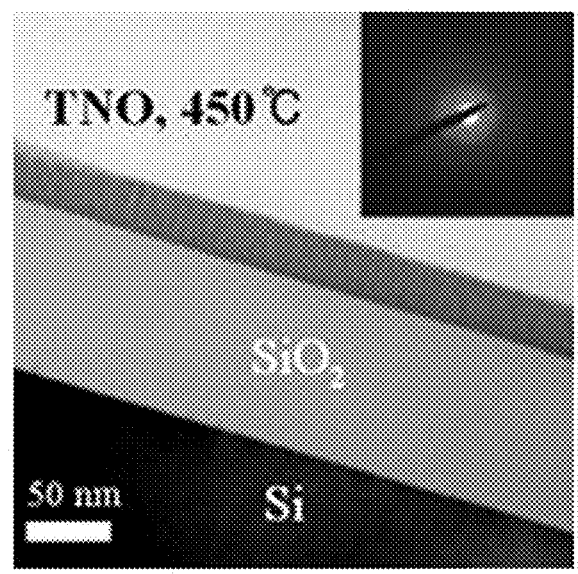

FIG. 5A and FIG. 5B are electron micrographs of a thin film structure in which an oxide semiconductor layer including titanium oxide is heat-treated. FIG. 5A is an electron micrograph of a thin film that is heat-treated at 450° C. after the oxide semiconductor layer including non-doped titanium oxide (TiOx) is deposited on a substrate including silicon (Si) and on an insulating layer including silicon oxide ($SiO_2$). FIG. 5B is an electron micrograph of a thin film that is heat-treated at 450° C. after the oxide semiconductor layer including titanium oxide (TiOx) doped with niobium (Nb) is deposited on the substrate including silicon (Si) and on the insulating layer including silicon oxide(SiO$_2$).

Referring to FIG. 5A, it may be confirmed that the crystallization is generated in the oxide semiconductor layer, where a right upper portion of FIG. 5A represents a grain that is displayed by a white point and is generated with a pattern analysis shape.

Differently from FIG. 5A, referring to FIG. 5B, it may be confirmed that the amorphous shape is maintained without the crystallization shape of the oxide semiconductor.

To apply the oxide semiconductor layer to a large area display, it is important for the amorphous state to be maintained like in an amorphous silicon semiconductor. Therefore, according to an exemplary embodiment of the invention, when forming the thin film transistor including the oxide semiconductor layer including titanium oxide (TiOx) doped with niobium (Nb), there is a merit that the amorphous state may be maintained after the heat treatment to provide the semiconductor characteristic.

Figure 6A:
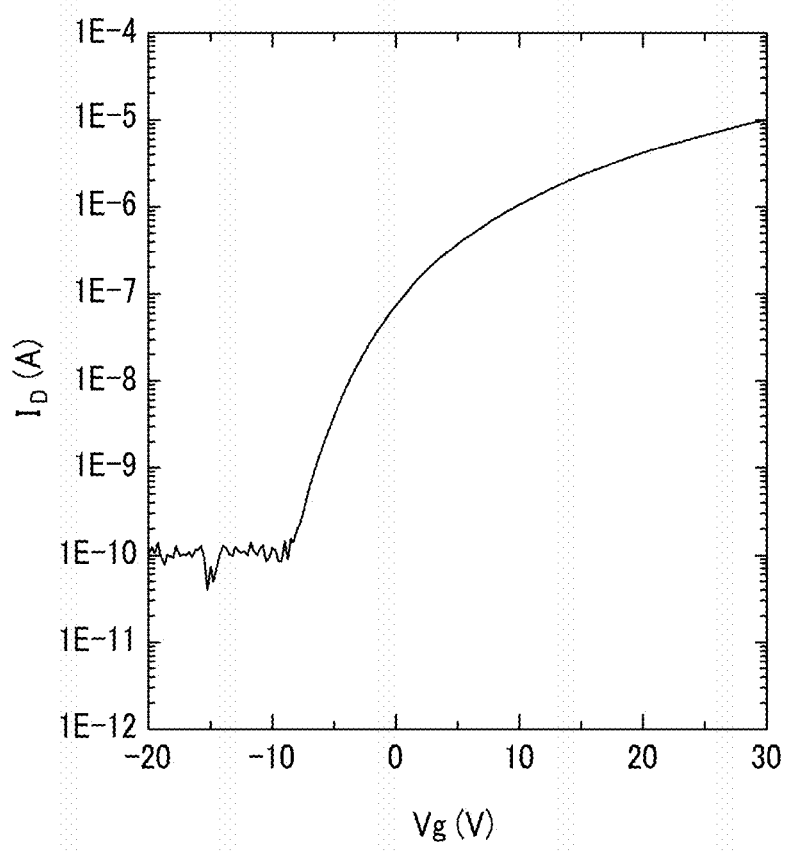
FIG. 6A and FIG. 6B are graphs of a voltage-current characteristic of an oxide semiconductor layer only including titanium oxide.
Figure 6B:
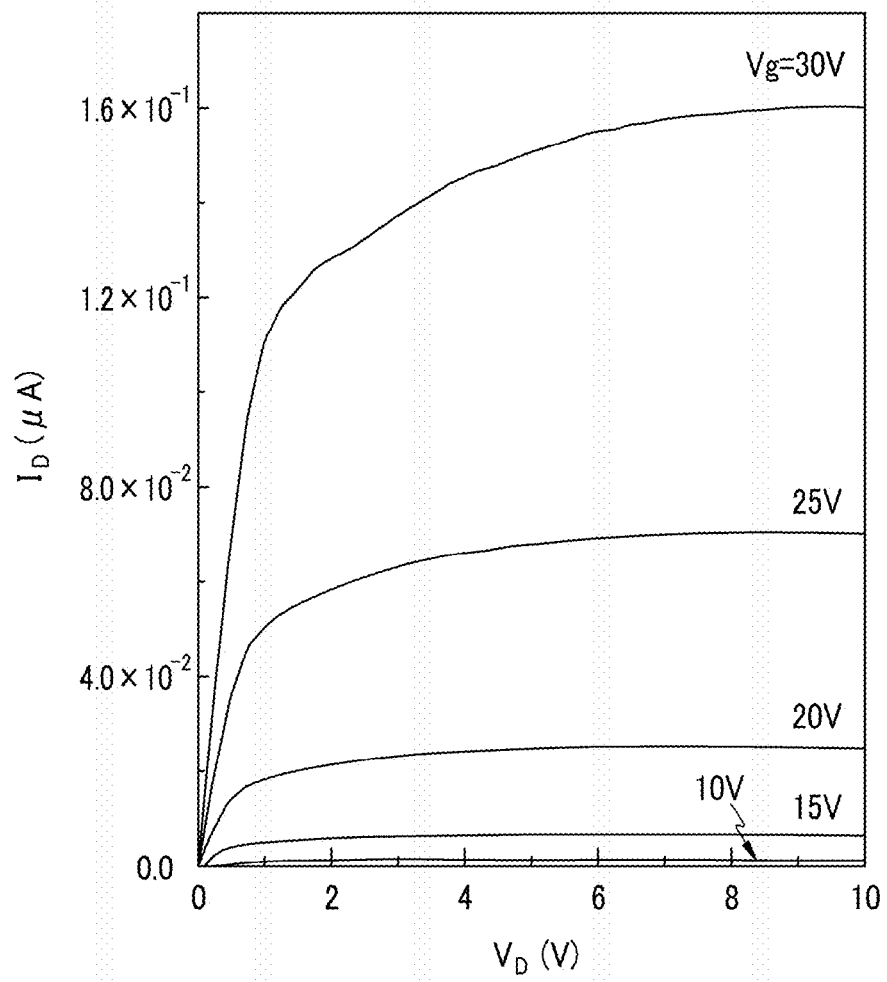
Figure 7A:
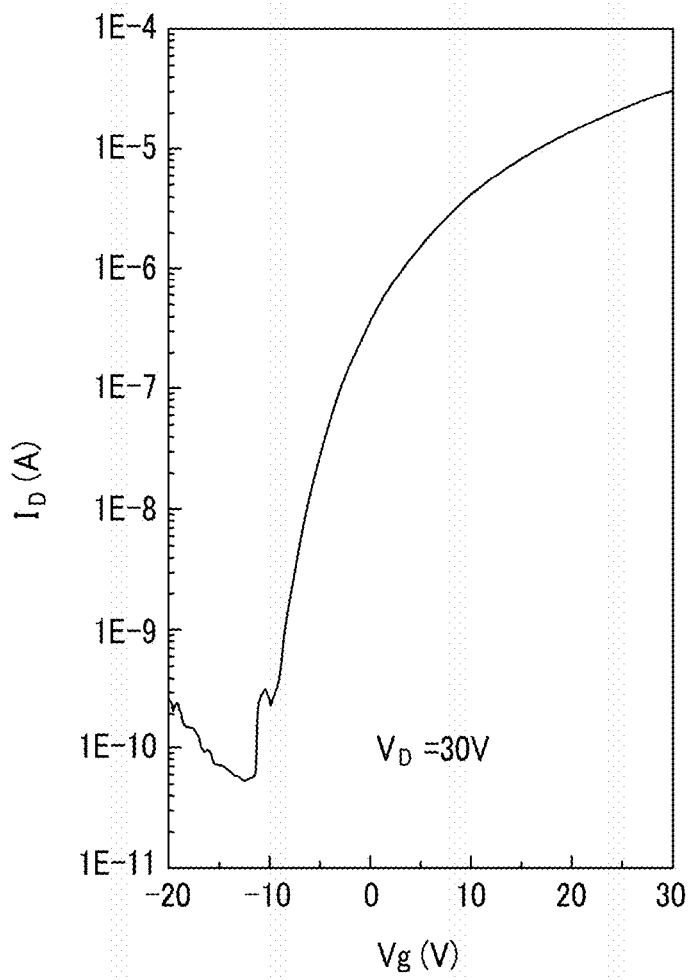
FIG. 7A and FIG. 7B are graphs of a voltage-current characteristic of an exemplary embodiment of an oxide semiconductor layer in which niobium is doped to titanium oxide according to the invention.
Figure 7B:
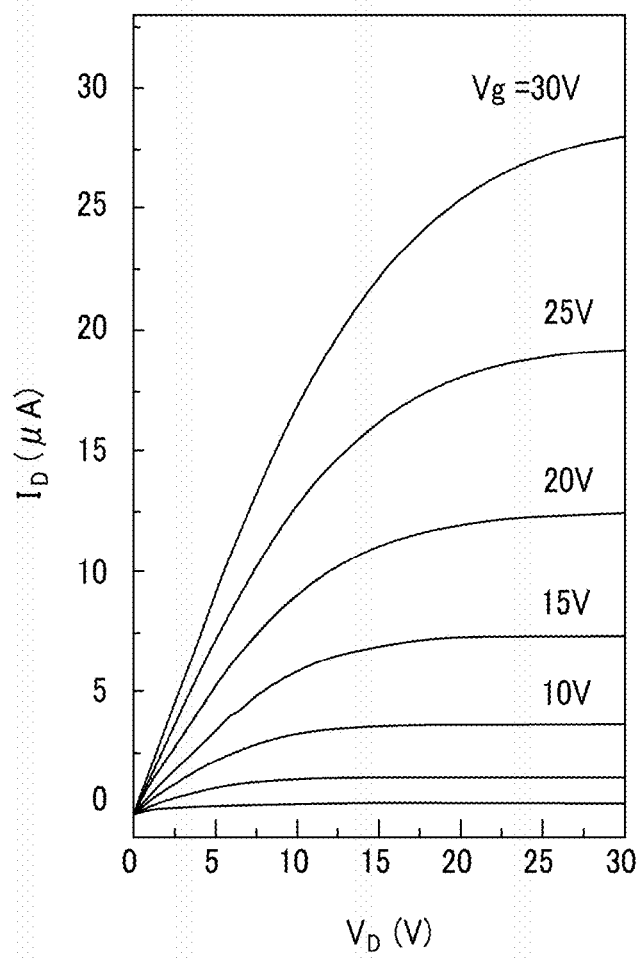

FIG. 6A and FIG. 6B are graphs of a voltage-current characteristic of an oxide semiconductor layer only including titanium oxide. FIG. 7A and FIG. 7B are graphs of a voltage-current characteristic of an exemplary embodiment of an oxide semiconductor layer in which niobium is doped to titanium oxide according to the invention.

As a result of comparing the graphs of FIG. 6A and FIG. 7A, in the case of the oxide semiconductor layer including titanium oxide (TiOx) that is not doped, a mobility result is measured as $1.00^{-3}$ cm$^2$/V·s, and in the case of the oxide semiconductor layer including titanium oxide (TiOx) doped with niobium (Nb), a mobility result is measured as $6.40^{-1}$ cm$^2$/V·s. Accordingly, in the case of doping niobium (Nb), the mobility is increased by about 640 times compared with the case of non-doping.

As a result of comparing the graphs of FIG. 6B and FIG. 7B, in the case of the oxide semiconductor layer including the titanium oxide (TiOx) that is not doped, an on current is 0.16 microampere (uA) at Vg of 30 V, and in the case of the oxide semiconductor layer including titanium oxide (TiOx) doped with niobium (Nb), the on current is 26 uA that is increased by about 160 times at Vg of 30 V.

Figure 8:
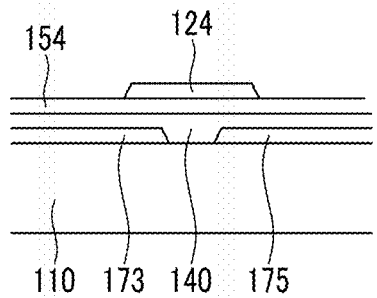
FIG. 8 is a cross-sectional view of another exemplary embodiment of a thin film transistor according to the invention.

FIG. 8 is a cross-sectional view of another exemplary embodiment of a thin film transistor according to the invention.

In the thin film transistor of FIG. 8, the gate electrode 124 is positioned on the oxide semiconductor layer 154, and the source electrode 173 and the drain electrode 175 are positioned under the oxide semiconductor layer 154, differently from the thin film transistor of FIG. 1. The source electrode 173 and the drain electrode 175 are in a same layer of the thin film transistor. The description of the material of each constituent element, the multilayer structure, the oxide semiconductor, etc., may be applied with the description of the thin film transistor of FIG. 1.

Figure 9:
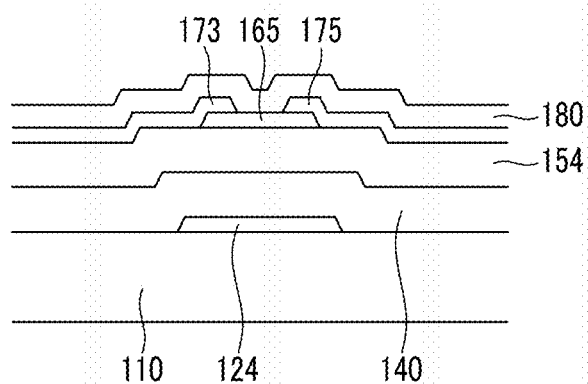
FIG. 9 is a cross-sectional view of still another exemplary embodiment of a thin film transistor according to the invention.

FIG. 9 is a cross-sectional view of still another exemplary embodiment of a thin film transistor according to the invention.

FIG. 9 represents an etch stopper, different from the exemplary embodiment of FIG. 1 representing a bottom gate and the exemplary embodiment of FIG. 8 representing a top gate. In detail, in the thin film transistor on the substrate 110 of FIG. 9, the gate electrode 124 corresponding to a control electrode is positioned, and the gate insulating layer 140 covering the gate electrode 124 is positioned on the substrate 110.

An etch stopper 165 is positioned at a position corresponding to the channel region of the semiconductor layer 154. The source electrode 173 and the drain electrode 175 overlapping the edge of the etch stopper 165 are positioned on the semiconductor layer 154 to be separated from each other. The source electrode 173 and the drain electrode 175 are in a same layer of the thin film transistor. The etch stopper 165 may be partially exposed at the position where the source electrode 173 and the drain electrode 175 are separated. The etch stopper 165 may include an oxide or nitride including silicon.

A passivation layer 180 is positioned on the source electrode 173 and the drain electrode 175. The passivation layer 180 fills a space where the source electrode 173 and the drain electrode 175 are separated, and covers the etch stopper 165 that is exposed through the separated space. Although not shown, an organic layer may be on the passivation layer 180.

The description of the material of each constituent element, the multilayer structure, the oxide semiconductor, etc., may be applied with the description of the thin film transistor of FIG. 1.

Next, an exemplary embodiment of a thin film transistor array panel according to the invention will be described with reference to FIG. 10 and FIG. 11. Hereafter, the thin film transistor array panel used in a liquid crystal display will be described as an example, but is not limited thereto or thereby. However, the thin film transistor array panel may be applied to a flat panel display such as an organic light emitting device.

Figure 10:
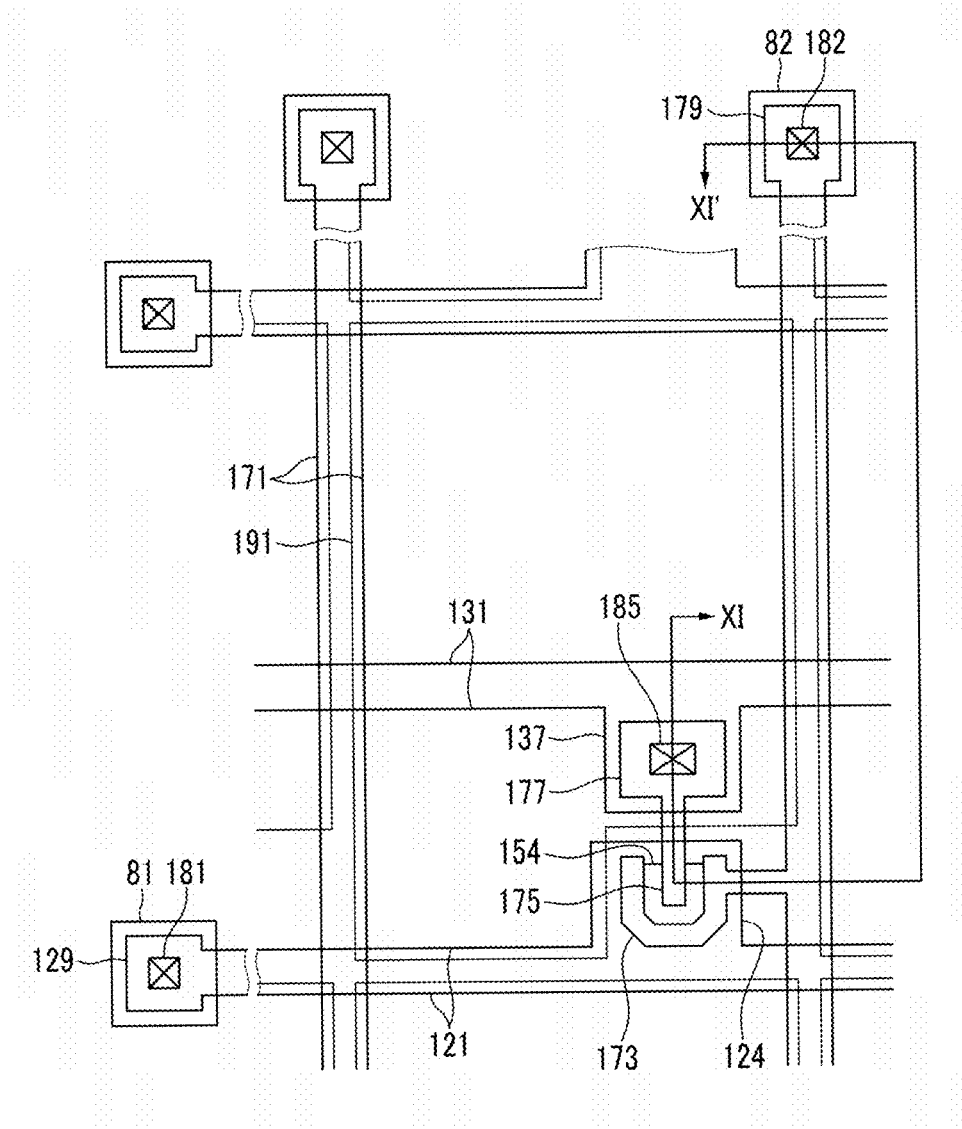
FIG. 10 is a top plan view of an exemplary embodiment of a thin film transistor array panel according to the invention.

FIG. 10 is a top plan view of an exemplary embodiment of a thin film transistor array panel according to the invention. FIG. 11 is a cross-sectional view taken along line XI-XI' of FIG. 10.

Figure 11:
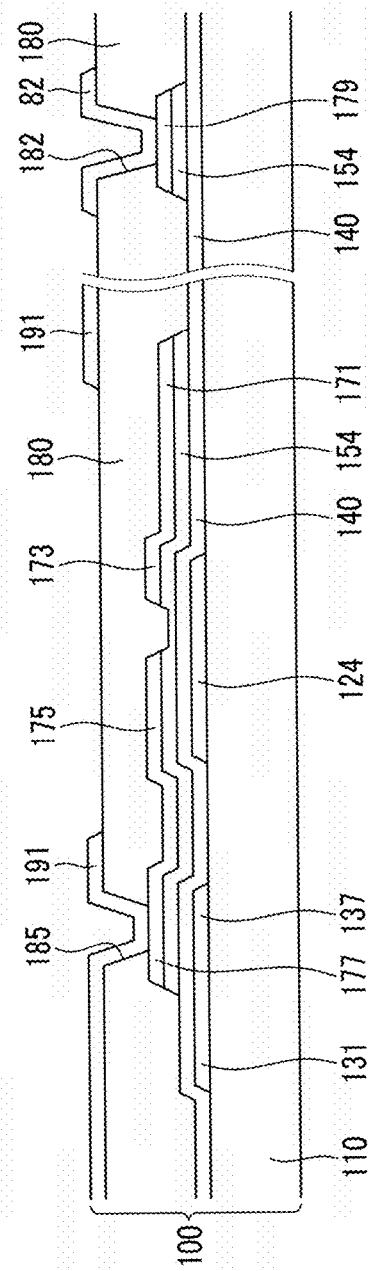
FIG. 11 is a cross-sectional view taken along line XI-XI' of FIG. 10.

Referring to FIG. 10 and FIG. 11, the thin film transistor array panel 100 includes a gate line (121 and 129), a gate electrode 124, a storage electrode line 131, and a storage electrode 137 positioned on an insulating substrate 110. The insulating substrate 110 may include glass or plastic. The gate line 121 transmits a gate signal and extends in an approximate row direction. The gate line 121 includes a plurality of gate electrodes 124 protruding upward in the plan view, and an end portion 129.

The storage electrode line 131 receiving a predetermined voltage extends substantially parallel to the gate line 121, and includes the storage electrode 137 with an approximate quadrangle shape in the plan view. Here, the shape and the arrangement of the storage electrode line 131 and the storage electrode 137 may be variously changed. Further, the storage electrode line 131 and the storage electrode 137 may be omitted.

The gate line (121 and 129) and the storage electrode line 131 may include an aluminum-based metal of aluminum (Al) or aluminum alloys, a silver-based metal of silver (Ag) or silver alloys, a copper-based metal of copper (Cu) or copper alloys such as CuMn, a molybdenum-based metal of molybdenum (Mo) or molybdenum alloys, chromium (Cr), tantalum (Ta), titanium (Ti), etc. Also, the gate line (121 and 129) and the storage electrode line 131 may include a transparent conductive material such as ITO, IZO, and AZO. The gate line (121 and 129) and the storage electrode line 131 may have a multilayered structure including two conductive films (not shown).

The gate insulating layer 140 is on the gate lines 121 and the storage electrode lines 131. The gate insulating layer 140 may at least one of include silicon nitride (SiNx), silicon oxide (SiOx), silicon oxynitride (e.g., SiON) or an organic insulating material. The gate insulating layer 140 may have a multilayered structure including at least two insulating layers (not shown). In one exemplary embodiment, for example, an upper layer of the gate insulating layer 140 may include SiOx and a lower layer may include SiNx, or the upper layer may include SiOx and the lower layer may include SiON. When the gate insulating layer 140 contacting the oxide semiconductor layer 154 includes an oxide, degradation of the thin film transistor channel may be reduced or effectively prevented.

The oxide semiconductor layer 154 is positioned on the gate insulating layer 140.

The oxide semiconductor layer 154 include titanium oxide (TiOx) doped with niobium (Nb). In an exemplary embodiment of the titanium oxide (TiOx) doped with niobium (Nb), the oxide semiconductor layer 154 is heat-treated to obtain a semiconductor characteristic in the state of having the insulating characteristic. The heat treatment temperature may be in the range of equal to or more than about 350° C. to equal to or less than about 550° C. If the heat treatment temperature is over 550° C., the amorphous characteristic may be lost, and if the heat treatment temperature is less than 350° C., generation of the semiconductor characteristic may be difficult.

In the exemplary embodiment, an amount of niobium (Nb) doped to the titanium oxide (TiOx) is preferably in a range of equal to or more than about 1 at. % to equal to or less than about 17 at. %.

A data line 171, the source electrode 173 and the drain electrode 175 are positioned on the oxide semiconductor layer 154. The data line 171 transmits a data voltage and extends in the approximate column direction thereby intersecting the gate line 121. The data line 171 includes an end portion 179 that is connected to the source electrode 173. The source electrode 173 is curved with a "U" shape in the plan view on the gate electrode 124. Also, the shape of the source electrode 173 may be variously changed.

The drain electrode 175 is separated from the data line 171 and includes a narrow first end portion and a wide second end portion 177. The narrow first end portion includes a distal end enclosed by the source electrode 173, and the wide second end portion 177 has an almost quadrangular shape in the plan view and overlaps the storage electrode 137. The wide second end portion 177 of the drain electrode 175 may occupy substantially the same area as the storage electrode 137 but is not limited thereto or thereby.

The data line (171 and 179), the source electrode 173 and the drain electrode (175 and 177) may include a material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), titanium (Ti) and a combination thereof. In one exemplary embodiment, for example, the molybdenum alloy may include Mo—Nb and Mo—Ti. Also, the data line (171 and 179), the source electrode 173, and the drain electrode (175 and 177) may include a transparent conductive material such as ITO, IZO or AZO, but is not limited thereto or thereby. The data line (171 and 179), the source electrode 173 and the drain electrode (175 and 177) may have a multilayer structure including at least two conductive layers (not shown). The data line (171 and 179), the source electrode 173 and the drain electrode (175 and 177) may have a triple-layer structure or a dual-layer structure such as Mo/Al/Mo, Mo/Al, Mo/Cu, CuMn/Cu, and Ti/Cu, but is not limited thereto or thereby.

The gate electrode 124, the source electrode 173 and the drain electrode 175 form a thin film transistor ("TFT") along with the oxide semiconductor layer 154. The source electrode 173 and the drain electrode 175 are in a same layer of the thin film transistor. The channel of the TFT is formed by the semiconductor 154 between the source electrode 173 and the drain electrode 175. The drain electrode 175 is connected to a pixel electrode 191 thereby applying a driving voltage to the pixel electrode 191.

The oxide semiconductor layer 154, the data line (171 and 179) and the drain electrode (175 and 177) may have substantially the same plane shape. However, the data line (171 and 179), the source electrode 173 and the drain electrode (175 and 177) do not cover the channel of the TFT. In an exemplary embodiment of forming a display panel, three layers including the gate insulating layer 140, the oxide semiconductor layer 154, and the data line (171 and 179) and drain electrode (175 and 177) may be sequentially deposited and patterned by using one mask. However, in an alternative exemplary embodiment, the oxide semiconductor layer 154 and the data line (171 and 179) may be formed by using individual masks.

A passivation layer 180 including at least one of silicon nitride (SiNx), silicon oxide (SiOx), or silicon oxynitride (e.g., SiON) is on the data line (171 and 179) and the drain electrode 175. The passivation layer 180 may include an organic insulating material. The passivation layer 180 may be multi-layered, but is not limited thereto or thereby. In one exemplary embodiment, for example, an upper layer of the passivation layer 180 may include SiOx and a lower layer may include SiNx, or the upper layer may include SiOx and the lower layer may include SiON. When the passivation layer 180 contacting the oxide semiconductor layer 154 includes an oxide, degradation of the channel may be reduced or effectively prevented.

The passivation layer 180 includes a contact hole 185 exposing the drain electrode 177, and a contact hole 182 exposing the end portion 179 of the data line 171. The pixel electrode 191 is connected to the drain electrode 177 through the contact hole 185. The end portion 179 of the data line 171 is connected to a connecting member 82 through the contact hole 182.

The passivation layer 180 and the gate insulating layer 140 may include a contact hole 181 exposing the end portion 129 of the gate line 121. The end portion 129 of the gate line 121 is connected to a connecting member 81 through the contact hole 181.

The pixel electrode 191 is positioned on the passivation layer 180. The pixel electrode 191 may include a transparent conductive oxide such as ITO and IZO. The connecting members 81 and 82 are disposed on the end portions 129 and 179 of the gate line 121 and the data line 171, respectively. The connecting members 81 and 82 may include the same material as the pixel electrode 191.

In the exemplary embodiment, the TFT has the bottom gate structure, however, is not limited thereto. As shown in FIG. 8 and FIG. 9, the TFT may be changed into various structures such as the top gate structure and the etch stopper structure.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor comprising:
   a gate electrode on a substrate;
   a source electrode on the gate electrode;
   a drain electrode at a same layer as the source electrode, and spaced apart from and facing the source electrode;
   an oxide semiconductor layer between the gate electrode and the source electrode or between the gate electrode and the drain electrode; and a gate insulating layer between the gate electrode and the source electrode or between the gate electrode and the drain electrode, wherein the oxide semiconductor layer comprises a continuous layer of amorphous titanium oxide doped with niobium.

2. The thin film transistor of claim 1, wherein
an amount of niobium doped to the titanium oxide is in a range from equal to or more than about 1 atomic percent to equal to or less than about 17 atomic percent.

3. The thin film transistor of claim 1, wherein
the gate electrode is between the substrate and the oxide semiconductor layer, and
the oxide semiconductor layer is between the source electrode and the gate electrode, and between the drain electrode and the gate electrode.

4. The thin film transistor of claim 3, further comprising
an etch stopper overlapping a channel portion of the oxide semiconductor layer, and overlapping edges of side surfaces of the source electrode and the drain electrode, the side surfaces facing each other,
the facing source and drain electrodes exposing the etch stopper.

5. The thin film transistor of claim 4, further comprising
an insulating layer on the source electrode and the drain electrode, and overlapping the exposed etch stopper between the source electrode and the drain electrode.

6. The thin film transistor of claim 5, wherein
the etch stopper comprises an oxide or nitride comprising silicon.

7. The thin film transistor of claim 6, wherein
the insulating layer comprises at least one of silicon oxide, silicon nitride or silicon oxynitride.

8. The thin film transistor of claim 1, wherein
the oxide semiconductor layer is between the gate electrode and the substrate, and
the source electrode and the drain electrode are between the oxide semiconductor layer and the substrate.

9. A thin film transistor array panel comprising:
a substrate;
a gate line on the substrate and comprising a gate electrode;
a gate insulating layer on the gate line;
an oxide semiconductor layer on the gate insulating layer;
a data line on the oxide semiconductor layer and connected to a source electrode;
a drain electrode on the oxide semiconductor layer and facing the source electrode; and
a passivation layer on the data line, the source electrode and the drain electrode,
wherein the oxide semiconductor layer comprises a continuous layer of amorphous titanium oxide doped with niobium, and
wherein the oxide semiconductor comprising the titanium oxide contacts the passivation layer.

10. The thin film transistor array panel of claim 9, wherein
an amount of niobium doped to the titanium oxide is in a range from equal to or more than about 1 atomic percent to equal to or less than about 17 atomic percent.

11. The thin film transistor array panel of claim 9, wherein
the oxide semiconductor layer except for a channel portion, has a same plane shape as the source electrode, the drain electrode and the data line.

12. The thin film transistor array panel of claim 11, further comprising
a pixel electrode on the passivation layer,
wherein
the passivation layer comprises a contact hole, and
the pixel electrode and the drain electrode are connected through the contact hole.

* * * * *